United States Patent
Ito et al.

(10) Patent No.: US 12,083,791 B2
(45) Date of Patent: Sep. 10, 2024

(54) LIQUID DISCHARGE DEVICE AND IMPRINT APPARATUS

(71) Applicant: CANON KABUSHIKI KAISHA, Tokyo (JP)

(72) Inventors: Sari Ito, Tochigi (JP); Masahiro Kuri, Tochigi (JP); Akiko Iimura, Tochigi (JP); Noriyasu Hasegawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 79 days.

(21) Appl. No.: 17/500,239

(22) Filed: Oct. 13, 2021

(65) Prior Publication Data
US 2022/0111634 A1    Apr. 14, 2022

(30) Foreign Application Priority Data
Oct. 14, 2020 (JP) .................. 2020-173538

(51) Int. Cl.
| | |
|---|---|
| B41J 2/45 | (2006.01) |
| B41J 2/045 | (2006.01) |
| B41J 2/14 | (2006.01) |
| B41J 2/165 | (2006.01) |
| G03F 7/00 | (2006.01) |

(52) U.S. Cl.
CPC ......... *B41J 2/0451* (2013.01); *B41J 2/04581* (2013.01); *B41J 2/14201* (2013.01); *B41J 2/16535* (2013.01); *G03F 7/0002* (2013.01)

(58) Field of Classification Search
CPC .................................................. B41J 2/0451
See application file for complete search history.

(56) References Cited

U.S. PATENT DOCUMENTS

| | | |
|---|---|---|
| 6,435,672 B1 | 8/2002 | Gröninger et al. |
| 7,618,105 B2 | 11/2009 | Takahashi et al. |
| 8,857,948 B2 | 10/2014 | Suzuki et al. |
| 9,849,669 B2 | 12/2017 | Fukazawa et al. |
| 11,084,280 B2 | 8/2021 | Nishikawa |

(Continued)

FOREIGN PATENT DOCUMENTS

| | | |
|---|---|---|
| EP | 3 045 314 A2 | 7/2016 |
| JP | 2004-181883 A | 7/2004 |

(Continued)

OTHER PUBLICATIONS

Machine generated English translation of JP2016135585A to Fukuda et al., "Inspection Method of Liquid Disharge Head, and Liquid Discharge Device"; translation retreieved via FIT database on Aug. 10, 2023; 37pp.*

(Continued)

*Primary Examiner* — Shelby L Fidler
(74) *Attorney, Agent, or Firm* — Venable LLP

(57) ABSTRACT

A liquid discharge device includes a container configured to contain a liquid; a discharge port which is formed by bonding a plurality of substrates and from which the liquid supplied from the container is discharged; a piezoelectric element provided in correspondence with the discharge port, and configured to generate energy for discharging the liquid from the discharge port; and a detection unit configured to detect peeling of a bonding surface between the plurality of substrates forming the discharge port.

12 Claims, 7 Drawing Sheets

(56) References Cited

U.S. PATENT DOCUMENTS

| | | | | |
|---|---|---|---|---|
| 2013/0293610 A1* | 11/2013 | Suzuki | ................ | B41J 2/04571 |
| | | | | 347/10 |
| 2014/0097267 A1* | 4/2014 | Shitara | ................. | B05B 15/555 |
| | | | | 134/99.1 |
| 2016/0144613 A1* | 5/2016 | Fukazawa | ............. | B41J 2/0451 |
| | | | | 347/14 |
| 2017/0217176 A1* | 8/2017 | Sato | .................... | B41J 2/04581 |

FOREIGN PATENT DOCUMENTS

| | | | | |
|---|---|---|---|---|
| JP | 2009-143126 A | | 7/2009 | |
| JP | 4826125 B2 | | 11/2011 | |
| JP | 2013-233656 A | | 11/2013 | |
| JP | 5486755 B2 | | 5/2014 | |
| JP | 2016-097636 A | | 5/2016 | |
| JP | 2016135585 A | * | 7/2016 | ............ B41J 2/0451 |
| JP | 2016-185502 A | | 10/2016 | |
| JP | 2020-049817 A | | 4/2020 | |

OTHER PUBLICATIONS

Office Action dated Jul. 5, 2024, in Japanese Patent Application No. 2020-173538.

\* cited by examiner

LIQUID DISCHARGE DEVICE AND IMPRINT APPARATUS

BACKGROUND OF THE INVENTION

Field of the Invention

The present invention relates to a liquid discharge device and an imprint apparatus, and more specifically, for example, a liquid discharge device that can detect chip peeling in a discharge portion including a discharge port for discharging a liquid, and an imprint apparatus.

Description of the Related Art

In some discharge devices that discharge a liquid, a piezoelectric element for discharging the liquid is provided, and the liquid is discharged by apply a driving pulse to the piezoelectric element. In such a liquid discharge device, the residual vibration of a vibrating portion, which is generated after forcibly vibrating the vibrating portion by applying a driving pulse to the piezoelectric element, may be detected as a counter electromotive force by the same piezoelectric element.

Japanese Patent No. 5486755 describes a method of detecting the presence of air bubbles or foreign substances in a discharge liquid from the counter electromotive force, and recovering a failure by setting a waiting time or the like. Further, Japanese Patent No. 4826125 describes a liquid discharge device that detects the remaining amount of a discharge liquid from the counter electromotive force.

However, in the above-described conventional examples, it is assumed to use the counter electromotive force waveform to detect air bubbles in the discharge liquid that decrease the discharge performance, or to detect the remaining amount of the liquid, but it is not assumed to detect peeling of a chip which forms the discharge portion. When chip peeling occurs due to improper bonding of the chip, the liquid does not leak out if it is partial peeling inside of the chip, but the liquid leaks out from the discharge device if peeling occurs in many places.

SUMMARY OF THE INVENTION

An aspect of the present invention is to eliminate the above-mentioned problem with conventional technology.

A feature of the present invention is to provide a liquid discharge device that detects peeling of a substrate forming a discharge port for discharging a liquid, and an imprint apparatus.

According to a first aspect of the present invention, there is provided a liquid discharge device comprising: a container configured to contain a liquid; a discharge port which is formed by bonding a plurality of substrates and from which the liquid supplied from the container is discharged; a piezoelectric element provided in correspondence with the discharge port, and configured to generate energy for discharging the liquid from the discharge port; and a detection unit configured to detect peeling of a bonding surface between the plurality of substrates forming the discharge port.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
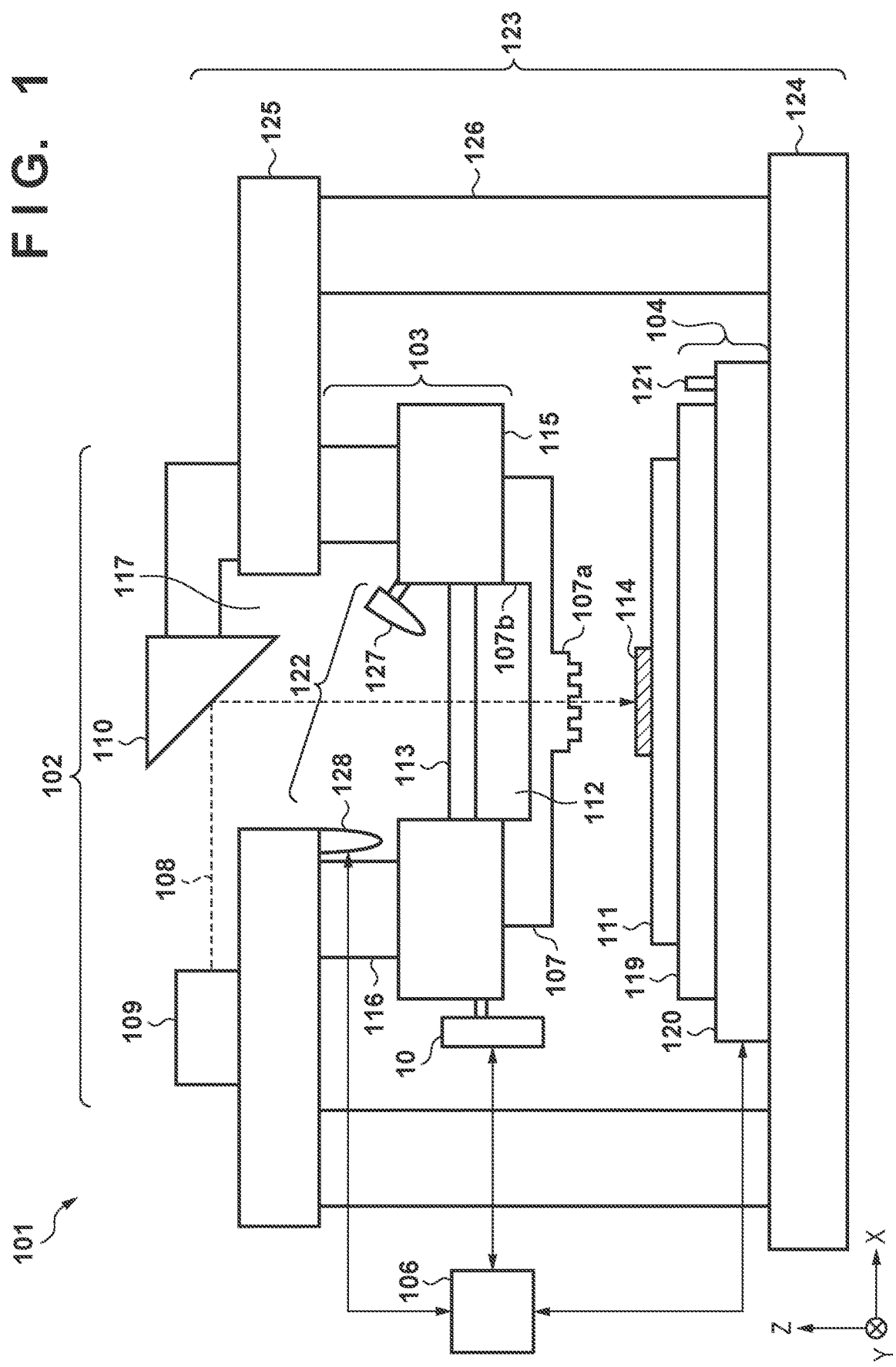
FIG. 1 is an outer perspective view showing the schematic arrangement of an imprint apparatus according to a representative embodiment of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Note that in this specification, a "nozzle" generically means a discharge port or a liquid channel communicating with it, and an element for generating energy used to discharge ink, unless otherwise specified.

A substrate for discharge head (head substrate or chip) used below means not merely a base made of a silicon semiconductor, but a configuration in which elements, wirings, and the like are arranged.

Further, "on the substrate" means not merely "on an element substrate", but even "the surface of the element substrate" and "inside the element substrate near the surface". In the present invention, "built-in" means not merely arranging respective elements as separate members on the base surface, but integrally forming and manufacturing respective elements on an element substrate by a semiconductor circuit manufacturing process or the like.

<Outline of Imprint Apparatus (FIGS. 1 and 2)>

FIG. 1 is a schematic view showing the arrangement of an imprint apparatus according to a representative embodiment of the present invention.

An imprint apparatus 101 shown in FIG. 1 is used in manufacturing various kinds of devices such as a semiconductor device. The imprint apparatus 101 includes a liquid discharge device 10. The liquid discharge device 10 discharges a discharge material (resist) 114 onto a substrate 111. The discharge material 114 is a light curable resin having a property of being cured by receiving ultraviolet light (UV). The discharge material 114 is appropriately selected in accordance with various kinds of conditions for a semiconductor device manufacturing process and the like. In addition to the light curable resist, for example, a thermosetting resist may be used as the discharge material, and the imprint apparatus may be an apparatus that performs an imprint process by curing the resist with heat. The discharge material 114 may be referred to as an imprint material.

The imprint apparatus 101 performs an imprint process including a series of following processing operations.

That is, the imprint apparatus 101 causes the liquid discharge device 10 to discharge the discharge material 114 onto the substrate 111. Then, the imprint apparatus 101 presses a mold 107 including a mold pattern against the discharge material 114 discharged onto the substrate and, in this state, cures the discharge material 114 by irradiation of light (ultraviolet light). Thereafter, the mold 107 is separated from the cured discharge material 114. Thus, the pattern of the mold 107 is transferred onto the substrate 111.

The imprint apparatus 101 includes a light irradiation unit 102, a mold holding mechanism 103, a substrate stage 104, the liquid discharge device 10, a control unit 106, a measurement unit 122, and a housing 123.

The light irradiation unit 102 includes a light source 109, and an optical element 110 for correcting ultraviolet light 108 emitted from the light source 109. The light source 109 is, for example, a halogen lamp that generates an i-line or a g-line. The ultraviolet light 108 is applied to the discharge material 114 via the mold 107. The wavelength of the ultraviolet light 108 is a wavelength corresponding to the discharge material 114 to be cured. Note that in a case of an imprint apparatus that uses a thermosetting resist as the resist, a heat source unit for curing the thermosetting resist is installed in place of the light irradiation unit 102.

The mold holding mechanism 103 includes a mold chuck 115 and a mold driving mechanism 116. The mold 107 held by the mold holding mechanism 103 includes a pattern portion 107a which has a rectangular outer peripheral shape and in which a concave-convex pattern such as a circuit pattern to be transferred is three-dimensionally formed on the surface facing the substrate 111. The material of the mold 107 in this embodiment is a material capable of transmitting the ultraviolet light 108 and, for example, quartz is used.

The mold chuck 115 holds the mold 107 by vacuum chuck or an electrostatic force. The mold driving mechanism 116 moves the mold 107 by holding and moving the mold chuck 115. The mold driving mechanism 116 can press the mold 107 against the discharge material 114 by moving the mold 107 in the −Z direction. Further, the mold driving mechanism 116 can separate the mold 107 from the discharge material 114 by moving the mold 107 in the +Z direction. An actuator that can be employed as the mold driving mechanism 116 is, for example, a linear motor or an air cylinder.

Each of the mold chuck 115 and the mold driving mechanism 116 includes an opening region 117 in the central portion. The mold 107 includes a concave-shaped cavity 107b in the surface to be irradiated with the ultraviolet light 108. A light transmitting member 113 is provided in the opening region 117 of the mold driving mechanism 116, thereby forming a sealed space 112 surrounded by the light transmitting member 113, the cavity 107b, and the opening region 117. The pressure in the space 112 is controlled by a pressure correction device (not shown). When the pressure correction device sets the pressure in the space 112 higher than the outside, the pattern portion 107a is bent in a convex shape toward the substrate 111. With this, the central portion of the pattern portion 107a is brought into contact with the discharge material 114. Accordingly, when the mold 107 is pressed against the discharge material 114, it is suppressed that a gas (air) is trapped between the pattern portion 107a and the discharge material 114. Thus, the discharge material 114 can be filled to every corner of the concave-convex portion of the pattern portion 107a. The depth of the cavity 107b that determines the size of the space 112 is appropriately changed in accordance with the size or material of the mold 107.

The substrate stage 104 includes a substrate chuck 119, a substrate stage housing 120, and a stage reference mark 121. The substrate 111 held by the substrate stage is a single-crystal silicon substrate or an SOI (Silicon on Insulator) substrate. The discharge material 114 is discharged onto the processed surface of the substrate 111, and the pattern is molded thereon.

The substrate chuck 119 holds the substrate 111 by vacuum chuck. The substrate stage housing 120 moves the substrate 111 by moving the substrate chuck 119 in the X direction and the Y direction while holding the substrate chuck 119 by a mechanical unit. The stage reference mark 121 is used in alignment between the substrate 111 and the mold 107 to set a reference position of the substrate 111. For example, a linear motor is used as an actuator of the substrate stage housing 120. In addition, the actuator of the substrate stage housing 120 may be configured to include a plurality of driving systems such as a coarse driving system or a fine driving system.

The liquid discharge device 10 discharges the uncured discharge material 114 in a liquid state from nozzles, thereby applying it on the substrate 111. In this embodiment, a method is employed in which the discharge material 114 is pushed out from a discharge port by utilizing the piezoelectric effect of a piezoelectric element. The control unit 106 (to be described later) generates a driving waveform for driving the piezoelectric element and applies it to the piezoelectric element, thereby driving the piezoelectric element so as to be deformed into a shape suitable for discharge. A plurality of nozzles are provided, and each nozzle is configured to be independently controllable. The amount of the discharge material 114 discharged from the nozzle of the liquid discharge device 10 is appropriately determined in accordance with the desired thickness of the discharge material 114 to be formed on the substrate 111, the density of the pattern to be formed, or the like.

The measurement unit 122 includes an alignment measuring device 127 and an observation measuring device 128. The alignment measuring device 127 measures the positional shift in the X direction and the Y direction between an alignment mark formed on the substrate 111 and an alignment mark formed in the mold 107. The observation measuring device 128 is, for example, an image capturing device such as a CCD camera. The observation measuring device 128 captures an image of the pattern of the discharge material 114 discharged onto the substrate 111, and outputs it to the control unit 106 as image information.

The control unit 106 controls operations of respective components of the imprint apparatus 101, and the like. The control unit 106 is formed by, for example, a computer including a CPU, a ROM, and a RAM. The control unit 106 is connected to the respective components of the imprint apparatus 101 via lines, and the CPU controls the respective components in accordance with control programs stored in the ROM. Further, the control unit 106 includes a display unit and can perform various kinds of display.

Based on the measurement information of the measurement unit 122, the control unit 106 controls the operations of the mold holding mechanism 103, the substrate stage 104, and the liquid discharge device 10. Note that the control unit 106 may be formed integrally with another portion of the imprint apparatus 101, or may be implemented as another apparatus different from the imprint apparatus. The control unit 106 may be formed by not one computer but a plurality of computers. The control unit 106 further includes a non-volatile memory such as an SSD (semiconductor disk) or an EEPROM. The information of the waveform of the counter electromotive force from the piezoelectric element obtained when the discharge material (liquid) is normally discharged from the discharge port, which will be described later, is stored in the nonvolatile memory.

The housing 123 includes a base plate 124 on which the substrate stage 104 is placed, a bridge plate 125 to which the mold holding mechanism 103 is fixed, and columns 126 extending from the base plate 124 and supporting the bridge plate 125.

The imprint apparatus 101 includes a mold conveying mechanism (not shown) that conveys the mold 107 from the outside of the apparatus to the mold holding mechanism 103, and a substrate conveying mechanism (not shown) that conveys the substrate 111 from the outside of the apparatus to the substrate stage 104.

Figure 2:
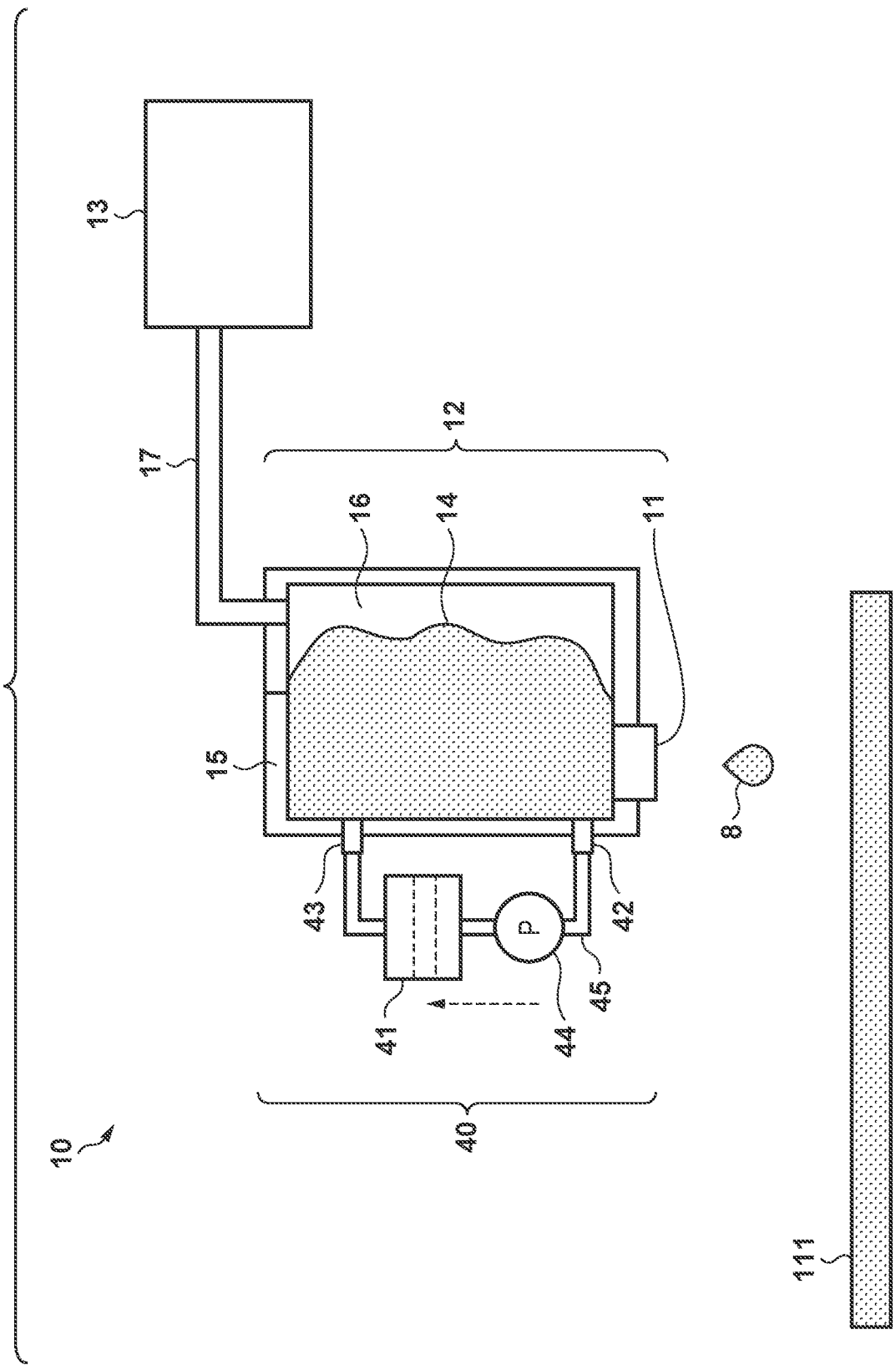
FIG. 2 is a view showing the arrangement of a main part of a liquid discharge device.

FIG. 2 is a view showing the arrangement of a main part of the liquid discharge device 10 shown in FIG. 1.

As shown in FIG. 2, the liquid discharge device 10 mainly includes a discharge portion 11, a liquid container 12 that contains the liquid, a pressure control unit 13 for controlling a pressure, and a circulation unit 40 that circulates the discharge material (liquid) inside the discharge portion 11. A separation film 14, which is made of a flexible material and separates the space inside the container, is provided inside the liquid container 12 that can contain the liquid. The thickness of the separation film 14 is preferably between 10 μm or more and 200 μm or less, and the separation film 14 is preferably made of a material having low permeability with respect to a liquid and a gas.

The separation film 14 can be formed of, for example, a film made of a fluororesin material such as PFA or a composite multilayer film obtained by combining a fluororesin material and a plastic material. A first liquid chamber 15, which is one of chambers partitioned by the separation film 14 of the container 12, contains the discharge material, and a second liquid chamber 16 (third space), which is the other one of the chambers, contains a filling liquid. The first liquid chamber 15 and the second liquid chamber 16 are separated by the separation film 14. The second liquid chamber 16 is connected to the pressure control unit 13 by a connection pipe 17. The first liquid chamber 15 is connected to the discharge portion 11.

The pressure control unit 13 includes a filling liquid tank, a pipe, a pressure sensor, a pump, a valve, and the like, and can control the pressure in the second liquid chamber 16. By controlling the pressure of the filling liquid in the second liquid chamber 16 using the pressure control unit 13, it is possible to control the pressure of the discharge material in the first liquid chamber 15 via the separation film 14. With this, the shape of the gas-liquid interface in the discharge portion 11 can be stabilized, and the discharge material having good reproducibility as a droplet 8 can be discharged onto the substrate 111.

The circulation unit 40 has an arrangement in which a passage 45 connected to the container 12 at both ends is provided outside the container 12 and a filter 41 and a pump 44 are arranged in the passage 45. The circulation unit 40 is connected to the first liquid chamber 15 of the liquid container 12, and the passage 45 communicates with the first liquid chamber 15 through a first opening 42 and a second opening 43 each of which is open to the first liquid chamber 15.

The first opening 42 is an opening for supplying the discharge material inside the first liquid chamber 15 to the inside of the passage, and the second opening 43 is an opening for supplying, to the first liquid chamber 15, the discharge material supplied from the first opening 42. The pump 44 and the filter 41, which filters the discharge material, are provided in the passage 45 connecting the first opening 42 and the second opening 43. In consideration of the possibility of generation of foreign substances in the discharge material caused by dust from the pump 44, the filter 41 is preferably arranged at a position on the downstream side of the pump 44 in the flow of the discharge material from the first opening 42 to the second opening 43.

The pump 44 is preferably provided in the passage 45, but may be provided outside the passage 45. When the pump 44 is driven, the discharge material contained in the first liquid chamber 15 is supplied from the first opening 42 to the passage 45. The discharge material supplied from the first opening 42 is filtered by the filter 41 by passing through the filter 41 in the passage 45. Thereafter, the discharge material returns to the first liquid chamber 15 via the second opening 43. Then, the discharge material is supplied again from the first opening 42. That is, the discharge material in the first liquid chamber 15 is filtered by the filter 41 while circulating.

Note that the liquid discharge device 10 may be configured to include the first liquid chamber 15, which contains the liquid, without the separation film inside the liquid container 12.

Figure 3:
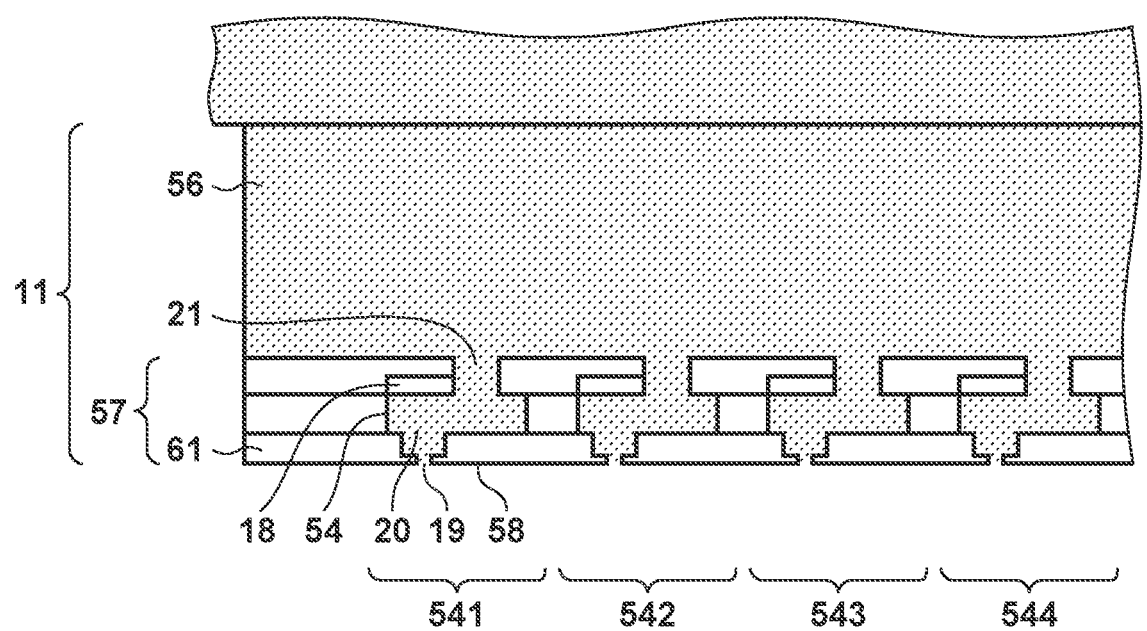
FIG. 3 is an enlarged view of a liquid discharge portion.

FIG. 3 is an enlarged sectional view showing the discharge portion 11.

As shown in FIG. 3, the discharge portion 11 includes a common liquid chamber 56 and a module board 57. The module board 57 is formed by a plurality of substrates (chips) bonded to each other by a bonding surface 61. The module board 57 is provided with a plurality of nozzles 54, each of which includes a supply port 21 for supplying the discharge material to the module board 57 and a discharge port 19 from which the discharge material can be discharged, and piezoelectric elements 18, each of which is provided in a corresponding nozzle 54 and serves as an energy generating element for discharging the discharge material. Four nozzles 541, 542, 543, and 544 are exemplarily shown in FIG. 3, but it is needless to say that more nozzles are provided in practice. Since a discharge material containing a large amount of resin is often used, a piezoelectric element is preferably used as the energy generating element.

The surface of the module board 57 provided with the discharge ports 19 is referred to as a discharge port-side surface 58. The opening area of the discharge port 19 is smaller than the opening area of the supply port 21, and the discharge port 19 has the smallest cross-section area in the flow passage in the nozzle 54. The supply port 21 communicates with the discharge port 19 in the module board 57. By controlling driving of the piezoelectric element 18 by the control unit 106, the discharge material in the interior (pressure chamber) 20 of the nozzle between the piezoelectric element 18 and the discharge port 19, which has been supplied from the supply port 21, is discharged from the discharge port 19 onto the substrate 111. The discharge portion 11 is preferably a discharge head used for an inkjet head or the like.

The residual vibration, which is generated after forcibly vibrating the piezoelectric element by applying a driving pulse to the piezoelectric element 18, is detected as a counter electromotive force by the same piezoelectric element 18. This counter electromotive force is detected for each nozzle.

Next, the counter electromotive force waveform obtained to detect chip peeling in the module board 57 of the detection port 11 will be described.

Figure 4A:
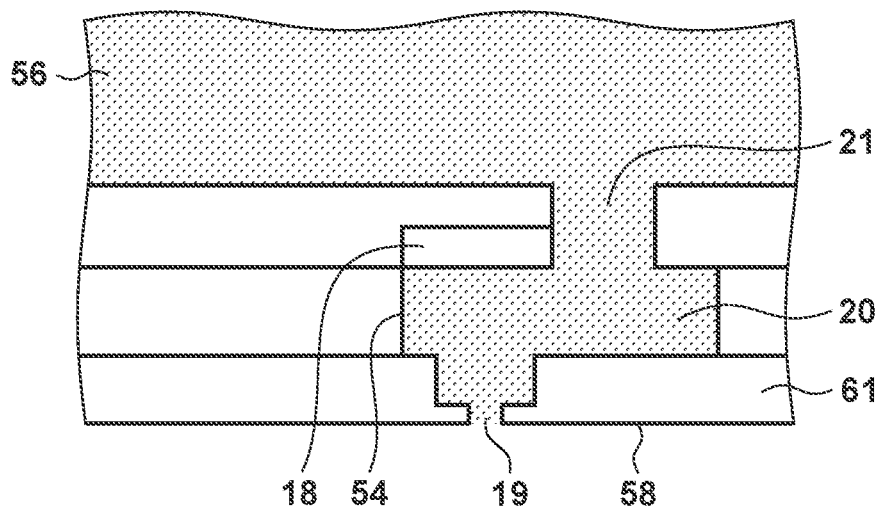
FIGS. 4A and 4B are enlarged views each showing a nozzle.
Figure 4B:
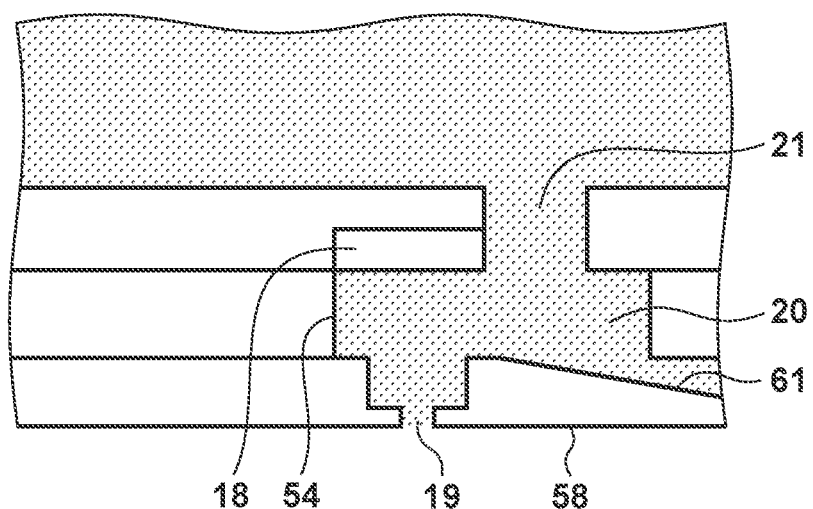
Figure 5A:
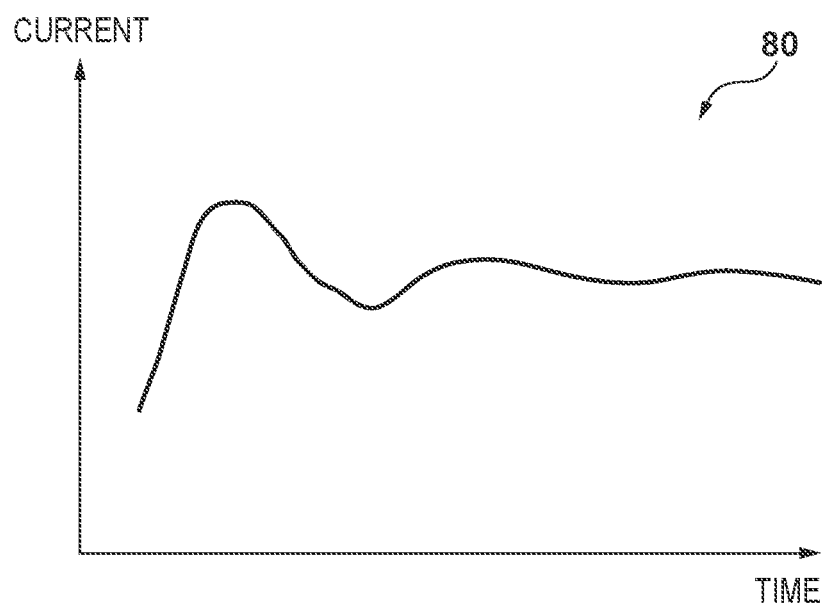
FIGS. 5A and 5B are graphs each schematically showing a counter electromotive force waveform.
Figure 5B:
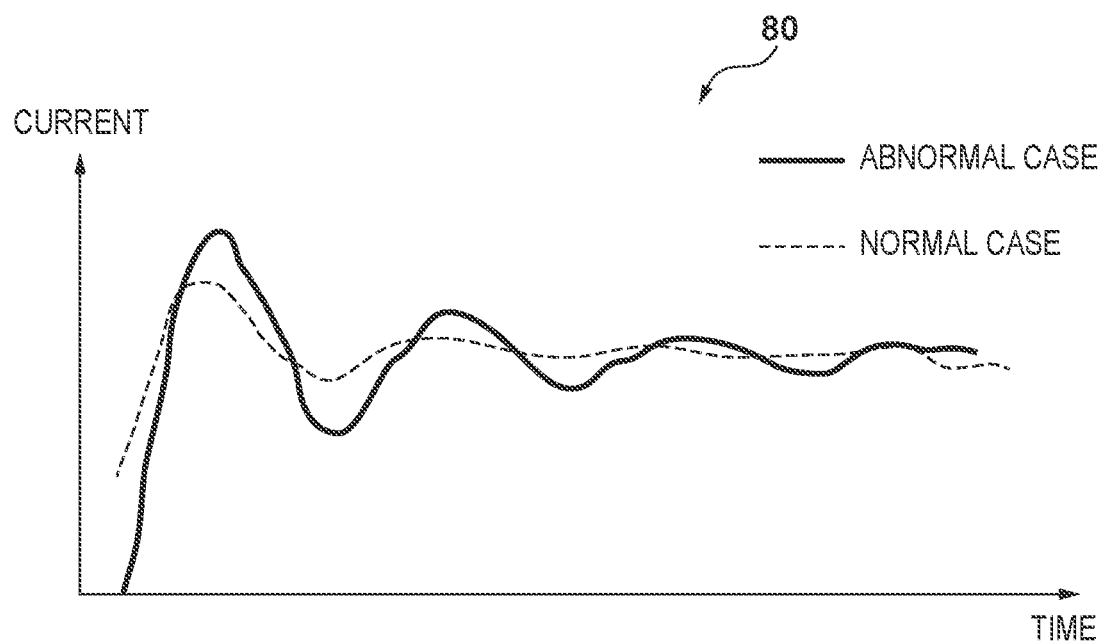

FIGS. 4A and 4B are enlarged sectional views each showing the nozzle 54, and FIGS. 5A and 5B are graphs each showing a time change of a counter electromotive force waveform 80.

FIG. 4A shows a state of the nozzle 54 in which no substate has peeled off the bonding surface 61 of the substrate (chip) so the discharge liquid, that is, the liquid does not leak from the interior 20 of the nozzle. For such the nozzle 54, when the driving pulse for obtaining a counter electromotive force waveform is applied to the piezoelectric element 18 to obtain the counter electromotive force, the time change of the counter electromotive force waveform 80 as shown in FIG. 5A can be obtained.

FIG. 4B shows a state of the nozzle 54 in which the substrate (chip) has partially peeled off the bonding surface 61 of the substrate (chip) so that the liquid leaks from the interior 20 of the nozzle to the side of another nozzle. For such the nozzle 54, when the driving pulse for obtaining a counter electromotive force waveform is applied to the piezoelectric element 18 to obtain the counter electromotive force, the counter electromotive force waveform 80 in an abnormal case as represented by the solid line in FIG. 5B is obtained. As compared with the waveform in a normal case represented by the dashed line, the obtained waveform has a larger amplitude and delayed phase. From this, it can be determined that peeling has occurred on the bonding surface 61 of the substrate (chip) in the discharge port 11. Note that depending on the arrangement, the waveform having a larger amplitude or a delayed phase as compared with the waveform in a normal case may be obtained.

Particularly, when substrate (chip) peeling has occurred in multiple nozzles, the space inside each nozzle increases and the volume of the flow passage increases. Thus, the difference between the counter electromotive force waveform 80 of the nozzle with the substrate peeling and the counter electromotive force waveform of the normal nozzle increases, and the peeling is easily detected.

By utilizing the characteristic as described above, in this embodiment, the counter electromotive force is detected for each nozzle 54, and the presence/absence of substrate peeling (chip peeling) corresponding to the interior 20 of each nozzle is determined.

Here, substrate peeling in the interior 20 of the nozzle will be described.

Figure 6:
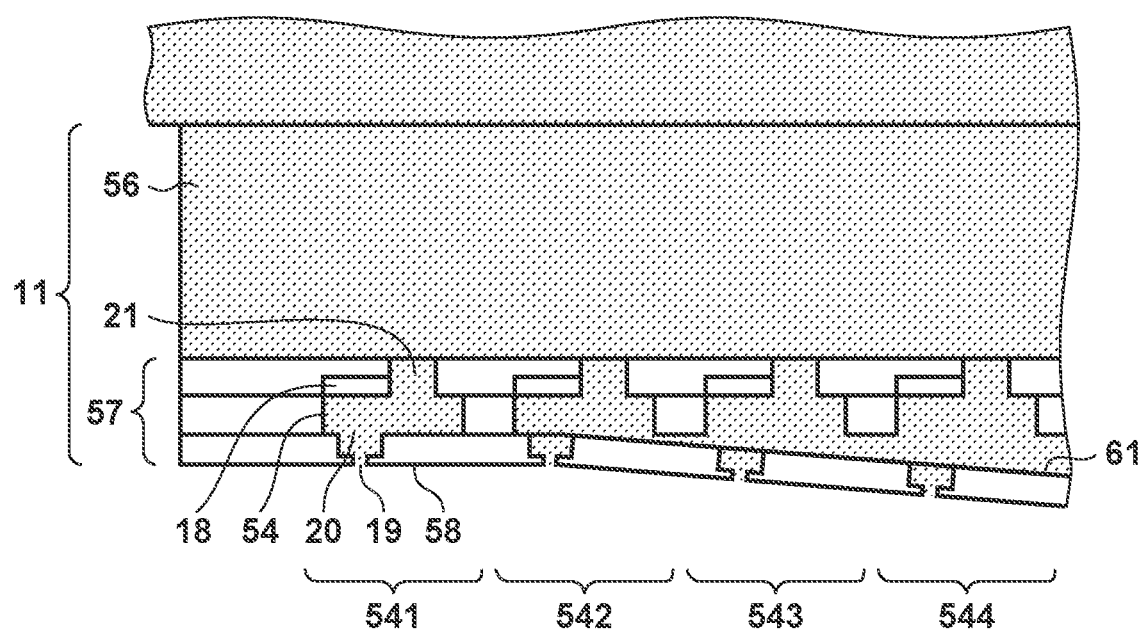
FIG. 6 is an enlarged view of the liquid discharge portion in which a chip substrate has peeled off.

FIG. 6 is a view schematically showing substrate peeling (chip peeling). FIG. 6 shows the nozzle 541, in which the liquid does not leak from the interior 20 of the nozzle, and a plurality of continuous nozzles, that is, the nozzles 542, 543, and 544, from which the liquid leaks from the interiors 20 of the nozzles.

Under the condition as described above, when the counter electromotive force is detected for each nozzle, the counter electromotive force waveform 80 as shown in FIG. 5A is obtained for the nozzle 541, and the counter electromotive force waveform 80 as represented by the bold line in FIG. 5B is obtained for each of the nozzles 542, 543, and 544. The larger the degree of chip peeling in the nozzle, that is, the larger the volume of the flow passage in the nozzle, the larger the change of the counter electromotive force waveform of the nozzle from that in the normal case. From this, it can be determined that the liquid leaks from the interiors of the three continuous nozzles. In this manner, if it is determined that the liquid leaks from at least two or more continuous nozzles, it is determined that substrate peeling (chip peeling) has occurred, and this is preferably displayed as an error.

Figure 7:
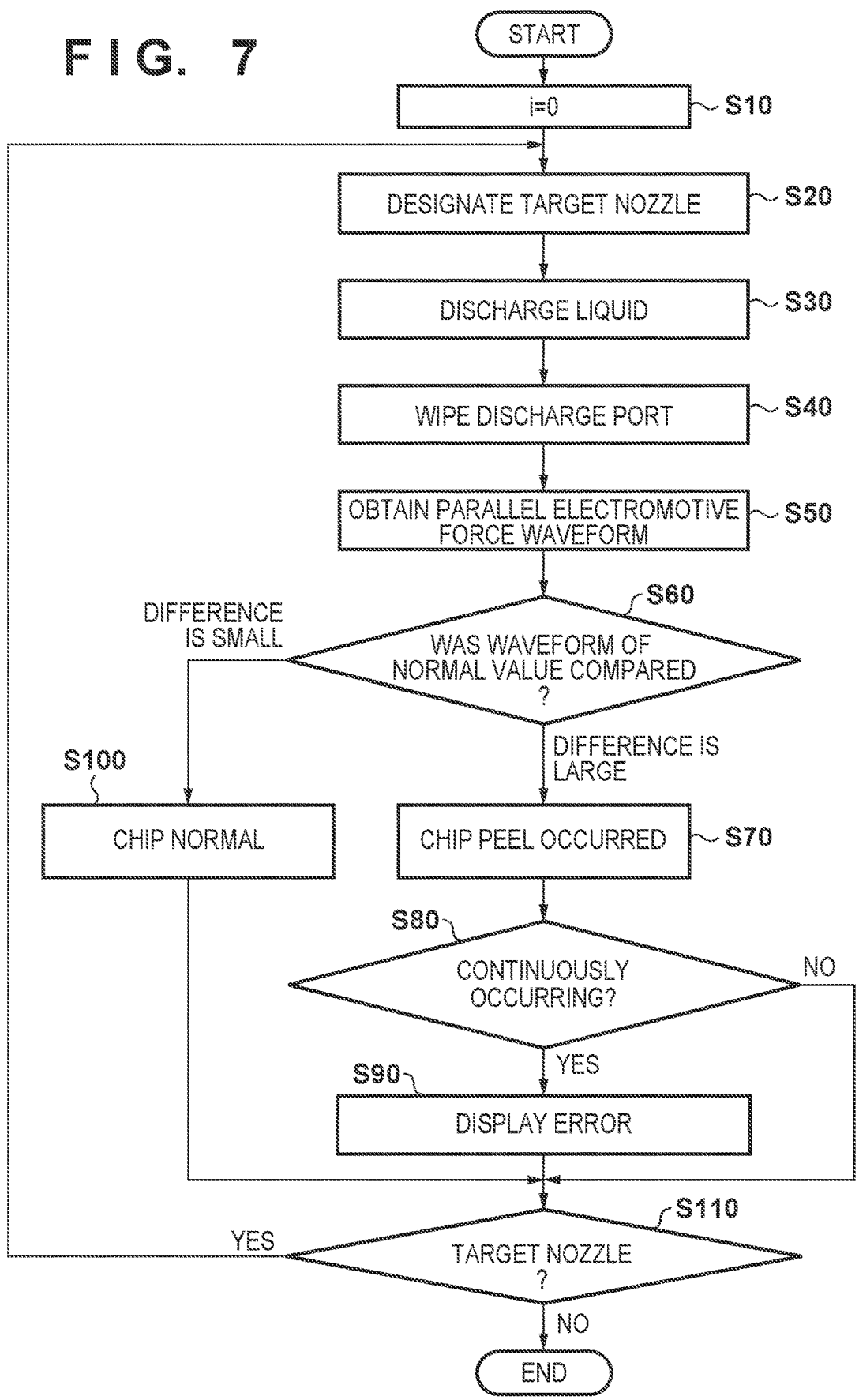
FIG. 7 is a flowchart illustrating a substrate peeling detection process to which a principle of detection of a counter electromotive force for each nozzle has been applied.

FIG. 7 is a flowchart illustrating a substrate peeling (chip peeling) detection process to which the above-described principle of detection of the counter electromotive force for each nozzle has been applied.

Note that the information of the waveform of the counter electromotive force, that is obtained from the piezoelectric element of the nozzle from which the liquid is normally discharged when a driving current is supplied to the piezoelectric element of each nozzle, is stored in the above-described nonvolatile memory of the control unit 106 in advance.

According to FIG. 7, in step S10, a parameter (i) for specifying the detection target nozzle is first initialized to "0". Next, in step S20, a numeric value for specifying the detection target nozzle is set in the parameter (i).

In step S30, the pressure control unit 13 applies a pressure of about 30 kPa to discharge the liquid from the discharge port 19. Then, in step S40, the liquid is wiped off from the discharge port-side surface 58, and it is confirmed that the discharge port-side surface 58 is not wet. This confirmation may be visual confirmation, but for more efficient and faster processing, it is desirable to confirm using image recognition based on an image obtained by capturing the image of the vicinity of the discharge port. Whatever the confirmation method, with this confirmation, it is possible to detect the counter electromotive force for each nozzle in a state in which the discharge port-side surface 58 is not wet with the liquid and no bubble has entered from the discharge port 19.

In step S50, the piezoelectric element 18 is driven to discharge the liquid from the nozzle, and the residual vibration generated after vibrating the piezoelectric element is detected and obtained as the counter electromotive force by the same piezoelectric element 18. Note that the liquid discharge device 10 normally controls the liquid to a negative pressure, so that it is difficult to determine substrate peeling (chip peeling). Therefore, detection of the counter electromotive force is preferably performed while applying a pressure from the pressure control unit 13 to the extent that the discharge port-side surface 58 does not get wet with the liquid. More specifically, detection of the counter electromotive force is performed while applying a pressure from the pressure control unit 13 to the interior of the liquid container 12 to the extent that the liquid is not discharged from the nozzle. With the control as described above, the volume of the liquid leaking from the interior 20 of the nozzle increases, and the counter electromotive force waveform 80 as shown in FIG. 5B appears more conspicuously. When the nozzle surface (discharge port-side surface 58) is coated with a liquid repellent, the pressure that does not cause the discharge of the liquid is set to about 2 to 3 kPa.

In step S60, the waveform of the obtained counter electromotive force is compared with the waveform of the counter electromotive force obtained in advance using the nozzle in a normal state without leakage of the liquid, and at least one of the amplitude difference and the phase difference obtained from the comparison is compared with a corresponding threshold value determined in advance. Note that this threshold value is also stored in the nonvolatile memory.

Here, if the difference is larger than the threshold value, the process advances to step S70, and it is determined that substrate peeling has occurred. Further in step S80, it is checked whether the substrate peeling has occurred in the continuous nozzles. Here, if it is determined that the substrate peeling has occurred in the continuous nozzles (for example, two or more nozzles), the process advances to step S90, and an error message is displayed on a display unit (for example, an LCD) of the imprint apparatus 101 or the liquid discharge device 10. This message may include the value of the parameter for specifying the detection target nozzle to specify the position where the continuous substrate peeling has occurred. Then, the process advances to step S110.

On the other hand, if it is determined in step S60 that the amplitude difference (phase difference) is equal to or smaller than the threshold value determined in advance, the process advances to step S100, and it is determined that no substrate peeling has occurred and the substrate is in a normal state. Then, the process advances to step S110.

In step S110, the detection process is terminated if there is no nozzle to be detected. However, if there is the nozzle to be detected, the process returns to step S20, and the detection process is continued by designating another nozzle.

Therefore, according to the embodiment described above, it is possible to detect leakage of the discharge liquid for each nozzle.

Note that the detection process of the counter electromotive force for each nozzle as described above is performed while discharge of the discharge liquid is not performed. More specifically, the detection process may be performed before the discharge, after the discharge, or both before and after the discharge.

Further more specifically, for example, when the liquid discharge device according to the present invention is mounted on an imprint apparatus and discharge and an imprint operation are repeatedly performed for each shot, the detection process of the counter electromotive force may be performed in a standby time between shots. Further, the detection process of the counter electromotive force may be performed in a standby time during a period in which the imprint operation is not performed, such as during wafer exchange or maintenance of the imprint apparatus. Furthermore, the detection process of the counter electromotive force may be performed before removing the liquid discharge device upon exchange of the liquid discharge device. The detection process of the counter electromotive force may be performed before discharge from the liquid discharge device after the exchange thereof. With this, it is possible to detect leakage of the discharge liquid and suppress the leakage of the discharge liquid to the minimum.

Note that in the above-described embodiment, peeling of the bonding surface of the substrate is detected by detecting the counter electromotive force for each nozzle, but the present invention is not limited to this. For example, the presence/absence of substrate peeling may be determined by measuring a change in height of the substrate surface by a gap sensor. Alternatively, a transparent parallel flat plate may be provided to be parallel in the vicinity of the nozzle surface, and the presence/absence of substrate peeling may be determined by applying light in a wavelength band insensitive to the liquid from the lower side of the parallel flat plate and measuring interference fringes by an image sensor (optical sensor) using a change in height of the substrate surface.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-173538, filed Oct. 14, 2020, which is hereby incorporated by reference herein in its entirety.

What is claimed is:

1. A liquid discharge device comprising:
a container configured to contain a liquid;
a plurality of discharge ports which are formed by bonding a plurality of substrates and from which the liquid supplied from the container is discharged;
a plurality of piezoelectric elements provided in correspondence with each of the discharge ports, and configured to generate energy for discharging the liquid from the discharge ports;
a detection unit configured to detect peeling of bonding surfaces between the plurality of substrates forming the discharge ports; and
a display unit configured to display an error message if the detection unit detects that the bonding surfaces between the plurality of substrates respectively forming the plurality of discharge ports have continuously peeled off, and configured not to display the error message if the detection unit detects that the bonding surfaces have peeled off, but have not continuously peeled off.

2. The device according to claim 1, wherein
the detection unit includes:
an obtainment unit configured to obtain a counter electromotive force from at least one of the piezoelectric elements when a driving current is supplied to the at least one piezoelectric element and the liquid is discharged from the corresponding discharge ports, and
a determination unit configured to determine, based on the counter electromotive force obtained by the obtainment unit, whether there is peeling of the bonding surface between the plurality of substrates forming the discharge ports.

3. The device according to claim 2, further comprising:

a storage unit configured to store information, which is obtained in advance, indicating a waveform of a counter electromotive force from the piezoelectric elements obtained when a driving current is supplied to the at least one piezoelectric element and the liquid is normally discharged from the corresponding discharge port.

4. The device according to claim 3, wherein the determination unit includes:

a first comparison unit configured to compare the information indicating the waveform of the counter electromotive force obtained by the obtainment unit with the information stored in the storage unit, and a second comparison unit configured to compare a waveform difference obtained from the comparison by the first comparison unit with a predetermined threshold value, and the determination unit determines, based on the comparison by the second comparison unit, whether there is peeling of the bonding surface between the plurality of substrates forming the discharge ports.

5. The device according to claim 4, wherein the waveform difference is at least one of a waveform difference in amplitude and a waveform difference in phase.

6. The device according to claim 2, further comprising:

a wiping unit configured to wipe a surface of the discharge ports before obtaining the counter electromotive force from at least one of the piezoelectric elements by the obtainment unit.

7. The device according to claim 2, further comprising:

a pressure application unit configured to apply, to an interior of the container, a pressure to an extent that the liquid is not discharged from the discharge ports while the counter electromotive force is obtained from the piezoelectric elements by the obtainment unit.

8. The device according to claim 7, wherein the pressure is 2 to 3 kPa.

9. The device according to claim 7, wherein the surface of the discharge ports is coated with a liquid repellent.

10. The device according to claim 1, wherein the detection unit includes:

a measurement unit configured to measure a change in the surface of the discharge ports, and a determination unit configured to determine, based on the change measured by the measurement unit, whether there is peeling of the bonding surface between the plurality of substrates forming the discharge ports.

11. The device according to claim 10, wherein the measurement unit includes an optical sensor.

12. An imprint apparatus that performs an imprint process on a substrate by discharging a liquid from a liquid discharge device defined in claim 1.

* * * * *